United States Patent [19]

Jensen

[11] Patent Number: 4,926,227
[45] Date of Patent: May 15, 1990

[54] SENSOR DEVICES WITH INTERNAL PACKAGED COOLERS

[75] Inventor: Earl M. Jensen, San Jose, Calif.

[73] Assignee: Nanometrics Inc., Sunnyvale, Calif.

[21] Appl. No.: 891,627

[22] Filed: Aug. 1, 1986

[51] Int. Cl.$^5$ .............................................. H01L 23/56
[52] U.S. Cl. ........................................ 357/28; 357/29; 357/30; 357/72; 357/81
[58] Field of Search .................... 357/28, 29, 30, 81

[56] References Cited
FOREIGN PATENT DOCUMENTS
53-13885  2/1978  Japan ...................................... 357/28

OTHER PUBLICATIONS
Dr. Adrian March, Improving on Faint Images, Apr. 1986, Sensor Review.

Primary Examiner—Rolf Hille
Assistant Examiner—Steven Loke
Attorney, Agent, or Firm—Linval B. Castle

[57] ABSTRACT

Heat sensitive sensors, such as charge coupled devices which must be cooled to reduce dark current leakage, are packaged in a chip carrier and in contact with the cold surface of an electrothermal cooler the warm opposite surface of which contacts the floor of the carrier to heat the carrier body and the window of the chip carrier to prevent fogging of the cover glass while the sensor remains cold.

2 Claims, 1 Drawing Sheet

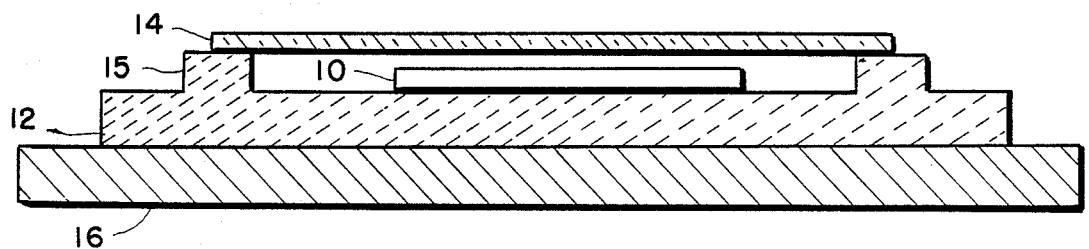
FIG. 1 — PRIOR ART
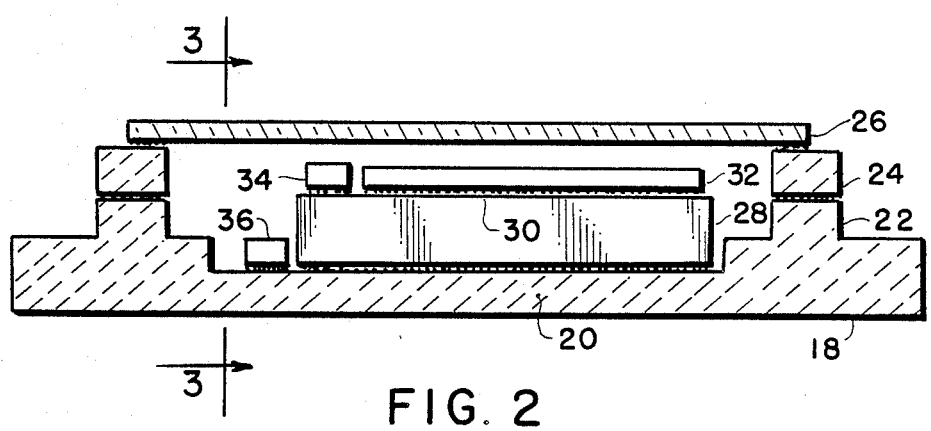
FIG. 2
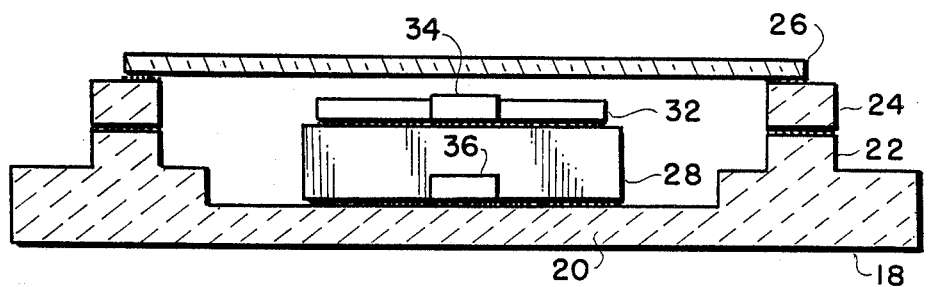
FIG. 3

SENSOR DEVICES WITH INTERNAL PACKAGED COOLERS

BRIEF SUMMARY OF THE INVENTION

This invention relates generally to semiconductor packaging and in particular to a novel package containing an electrothermal cooler for cooling a sensor, such as a charge coupled device within the package, while simultanesouly warming the package to eliminate fogging of the window.

Some sensors, such as charge coupled devices, (CCD), are formed with a series of charge or pixel wells which become filled with electrons generated in the surface junction by either photons or charged particles. The sensitivity of the CCD, and also of Charge Injection Devices in which electrons are withdrawn from pre-filled charge wells, makes them quite suitable for use as photographic detectors or in those industries where they may be used for charged particle detection. The charges contained in the wells of these devices, both of which will be referred to as sensors are read by serially shifting them through the device to the output and through a suitable amplifier to produce very low noise output signals not obtainable by other techniques.

An important characteristic of CCD type sensors is that they comprise charge wells in silicon bulk material with PN junctions at the surface thereof. A leakage current, or dark current, that occurs through the junction not only limits the available integration in the charge well, but also introduces a detremental temperature induced Schott noise. For example, at room temperatures, the leakage or dark current may fill the pixel charge wells in a period as short as eight seconds to render useless the sensor or at least that filled pixel well.

It has been found that by cooling the sensor the dark current is reduced and, for every 7° C. drop in sensor temperature, the time required for filling the charge wells by the dark current is approximately doubled. Stated another way, the dark current is reduced by a factor of two for every 7° C. drop in temperature and, further, the Schott effect noise is reduced by the square root of the dark current reduction. Thus, for satisfactory operation of a temperature sensitive sensor, such as a CCD, it is important to extend its range by providing some means for cooling the device, particularly if used for low light level measurements requiring a relatively long exposure time.

The proper cooling of temperature sensitive sensors is easily achieved under laboratory conditions by use of a refrigerant such as freon, liquid nitrogen, or by large thermoelectric coolers, etc. applied to the detector housing or to a heat sink coupled to the detector housing. While quite satisfactory for use in fixed locations, such types of refrigerants lack the portability required for many applications.

Several attempts have been made to package a sensor in contact with a large heat sink for providing the necessary cooling. In general, such attempts have been somewhat unsatisfactory because of the absence of sufficient cooling and/or cooling of the sensor package resulting in the fogging of the chilled cover glass overlying the sensor, and also because of the required large size of the package. The cooling problems have been solved by placing the heat sink in contact with a refrigerant, but the advantages of such cooling have been offset by the added bulkiness of the cooling equipment. The invention disclosed herein overcomes the above problems and provides means for packaging a CCD or other type of heat sensitive sensor, together with an electrothermal device that can drop the operating temperature of the sensor approximately 40°–60° C. below ambient without fogging the cover glass or window of the package.

There are two types of electrothermal cooling devices that are commercially available at the present time: the Peltier cooler and the Joule-Thompson device. Both types may be used within a chip package for cooling a heat sensitive sensor such as a CCD and both are adequately small and compact to fit within a hybrid package compatible with a conventional semiconductor chip carrier. The Joule-Thompson device is capable of reaching very low temperatures of about 75° K. at low power loads. The Peltier cooler has very favorable power loading and a single element will reach temperatures in the order of 40° to 60° C. below ambient, a temperature level generally adequate for cooling a heat sensitive sensor such as a CCD.

Briefly described, the invention comprises a hybrid package, compatible with standard semiconductor packages, and having a semiconductor cooler, such as a Peltier cooler, cemented to the inner floor. Overlying and in contact with the cold surface of the cooler is the sensor, such as a CCD, and overlying the sensor surface and spaced therefrom is the cover window which is sealed by epoxy to the side walls of the package. To prevent air leakage through the epoxy seals and to prevent fogging of the inner surface of the window, the air space within the package is replaced with a dry gas, such as nitrogen, at atmospheric pressure. Thus, the electrothermal cooler cools the sensor positioned adjacent the cooler's cold surface, while the opposite warm surface of the cooler heats the material of the package and the window to prevent condensation and fogging.

BRIEF DESCRIPTION OF THE DRAWINGS

In the drawings which illustrate the preferred embodiment of the invention:

FIG. 1 is a cross sectional side view of a prior art design;

FIG. 2 is a cross sectional side view of the improved semiconductor detector package with contained solid state cooling device., and FIG. 3 is a cross sectional end view taken along the lines 3—3 of FIG. 2.

DETAILED DESCRIPTION OF THE PREFERRED EMBODIMENT

To better appreciate the invention to be described, a very brief description of the prior art illustrated in FIG. 1 will first be presented. In FIG. 1, a heat sensitive sensor 10 is installed on the floor of a package or chip carrier 12 and is covered with a window 14 which is supported above the top surface of the sensor 10 by carrier side walls 15. The sensor 10 requires cooling to slow the flow of leakage or dark current that will normally fill the pixel or charge wells in the chip in approximately eight seconds, as previously discussed. Therefore, the entire package including the sensor and its carrier is cooled by adhering it to the surface of a relatively large heat sink 16, which may be separately cooled by a suitable refrigeration system (not shown). The entire package is thus bulky, it requires separate cooling means and, since the cover window is also cooled by its contact with the chip carrier 12 and surrounding cold air, the window readily becomes fogged and is thus incapable of accurately reproducing a photographic image of an object that may be projected onto the sensor.

FIG. 2 is a sectional side view illustrating the improved sensor package which includes a substantially square hybrid, ceramic chip carrier 18 having around the outer edge thereof a total of about 68 leads or connection tabs (not shown). The chip carrier 18 has an overall width of approximately 24 mm and recessed floor section 20 with a thickness of about ¾ mm. To provide adequate space for the combined heights of a solid state cooler and sensor, the side walls 22 of the chip carrier, which have a height of about 2 mm above the bottom surface of the carrier 18, are raised to a total height of about 4½ mm by the addition of a spacer 24 secured by an epoxy seal to the top surface of the side walls 22. An edge surface of a cover glass or window 26 is secured to the top surface of the spacer 24 by an epoxy seal to thus form a roof to the chip carrier. The square spacing between opposite side walls 22 of the chip carrier is about 16 mm.

Secured to the floor within the chip carrier 18 by an epoxy cement is a solid state Peltier cooler 28, such as commercially manufactured by Marlow Industries, Inc., of Dallas, Tx. These coolers, named for their employment of the Peltier effect, are constructed of P and N type semiconductor materials, their connection being purely ohmic and without any diode junction. With the application of electrical current, electrons pass from a low energy state in the P-type material to a higher energy stage in the N-type material, the differences in energy being absorbed as heat. By reversing the direction of electron flow, the direction of heat conduction is also reversed. In the operation of a Peltier cooler, one of its surfaces is cooled while the opposite surface is heated, the particular surface being dependent upon the direction of electron flow and hence polarity of applied current.

The current polarity applied to the Peltier cooler 28 is such that the lower surface of the unit that is secured to the inner floor of the chip carrier 18 radiates heat which may be dissipated by a heat sink (not shown) beneath the chip carrier while the top surface 30 of the cooler 28 is cooled. The sensor 32 is in contact with the surface 30 and is secured thereto by an epoxy cement. The sensor 32 may be cooled to as much as 50° C. below ambient (e.g. −30° C.) to thereby substantially slow or stop the flow of dark current that deleteriously affects the readout accuracy of a CCD.

While the sensor 32 is cooled by its contact with the cold surface 30 of the Peltier cooler, the opposite warm surface of the cooler operates to heat the chip carrier and remainder of the package including the window. A space of about 1½ mm between the top surface of the sensor and the bottom surface of the cover window 26 as well as all other air spaces in the package is replaced by dry nitrogen at approximately atmospheric pressure. This gas at a zero pressure differential eliminates the possibility of moisture leakages through the epoxy seals that would normally occur if the interior of the chip carrier were evacuated, and which could fog the interior of the window if the gas became sufficiently cold to drop the cover glass temperature below the dew point. Thus, the cold top surface 30 of the Peltier cooler 28 cools the sensor 32 while the hot lower surface of the cooler 28 heats the ceramic chip carrier 18 which conducts some of the heat to the cover window 26 to maintain the temperature of the window above that at which moisture will condense to fog the window.

For monitoring the temperature at the cooling surface 30 of the Peltier cooler 28, and thus for controlling the current into the cooler, a heat sensor 34, such as a type LM335 temperature sensor, is attached by epoxy cement to the cooling surface 30 of the cooler. If desired, a second temperature sensor 36 may be attached to the inner floor of the carrier to measure the temperature of the warm surface of the cooler 28.

FIG. 3 is a sectional end view taken along the lines 3—3 of FIG. 2 and illustrates the chip carrier 18, and the preferred positioning of the Peltier cooler 28, the sensor 32 in contact with the top surface of the cooler, the spaced cover window 26, and the heat sensors 34 and 36. The positions of the various components are determined by the selection and dimensions of the particular chip carrier and other chip carriers may, of course, be selected as desired.

Having thus described my invention, what is claimed is:

1. A package having a floor, a roof, side walls coupled between said floor and said roof, and a window, said package containing a heat sensitive sensor and means for cooling said sensor and for heating said package and window to reduce fogging thereof, said means including an electrothermal cooler having a first surface in contact with the floor of said package and a second surface in contact with said sensor, said cooler developing a warm first surface and a cold second surface upon the application of electrical current of a particular polarity.

2. The package claimed in claim 1 wherein said heat sensitive sensor is a charge coupled device.

* * * * *